US012800657B2

(12) United States Patent
Kalfoudis et al.

(10) Patent No.: US 12,800,657 B2
(45) Date of Patent: Nov. 17, 2026

(54) ARRANGEMENT AND METHOD FOR MONITORING A PLURALITY OF SHORT-CIRCUIT FORMING INDICATING ELEMENTS

(71) Applicant: Siemens Aktiengesellschaft, Munich (DE)

(72) Inventors: Panagiotis Kalfoudis, Prague (CZ); Aristotelis Antoniou, Prague (CZ); Tobias Gramolla, Kümmersbruck (DE)

(73) Assignee: Siemens Aktiengesellschaft, Munich (DE)

( * ) Notice: Subject to any disclaimer, the term of this patent is extended or adjusted under 35 U.S.C. 154(b) by 306 days.

(21) Appl. No.: 18/321,055

(22) Filed: May 22, 2023

(65) Prior Publication Data

US 2023/0384379 A1 Nov. 30, 2023

(30) Foreign Application Priority Data

May 24, 2022 (EP) .................................... 22175146

(51) Int. Cl.
*G01R 31/327* (2006.01)
*G05B 9/03* (2006.01)

(52) U.S. Cl.
CPC ........... *G01R 31/3277* (2013.01); *G05B 9/03* (2013.01)

(58) Field of Classification Search
CPC .... G01R 31/3277; G01R 31/52; G01R 31/50; G05B 9/03; H03K 17/18
See application file for complete search history.

(56) References Cited

U.S. PATENT DOCUMENTS

| | | | |
|---|---|---|---|
| 3,777,068 | A | 12/1973 | Monin et al. |
| 5,172,346 | A | 12/1992 | Wagner et al. |
| 7,173,594 | B2 | 2/2007 | Nakamura et al. |
| 7,692,618 | B2 | 4/2010 | Nakamura et al. |
| 10,439,386 | B2 | 10/2019 | Herrmann et al. |
| 11,619,919 | B2 | 4/2023 | Le et al. |
| 2001/0024125 | A1 | 9/2001 | Groenewold et al. |
| 2002/0101945 | A1 | 8/2002 | Audy et al. |

(Continued)

FOREIGN PATENT DOCUMENTS

| | | |
|---|---|---|
| CN | 2131244 | 4/1993 |
| CN | 1517757 | 8/2004 |

(Continued)

OTHER PUBLICATIONS

EP Search Report dated Nov. 16, 2022 based on EP22175146.4 filed May 24, 2022.

(Continued)

*Primary Examiner* — Lee E Rodak
*Assistant Examiner* — Demetrius R Pretlow
(74) *Attorney, Agent, or Firm* — Cozen O'Connor

(57) ABSTRACT

A method for monitoring a plurality of short-circuit forming indicating elements, wherein each indicating element has at least two current paths which are short-circuited upon actuation of the indicating element, where the current paths of the indicating elements are supplied with different signal sequences such that a simple, decodable, unique, binary representation of the state of the connected pressure sensitive mats exists at each time instant within a predetermined time frame.

9 Claims, 2 Drawing Sheets

(56) References Cited

U.S. PATENT DOCUMENTS

| | | | | |
|---|---|---|---|---|
| 2004/0119596 | A1 * | 6/2004 | Nelson | G08B 21/02 340/666 |
| 2004/0164976 | A1 | 8/2004 | Nakamura et al. | |
| 2007/0120803 | A1 | 5/2007 | Nakamura et al. | |
| 2011/0204729 | A1 | 8/2011 | Lorenz et al. | |
| 2018/0054051 | A1 | 2/2018 | Herrmann et al. | |
| 2019/0391549 | A1 | 12/2019 | Le et al. | |

FOREIGN PATENT DOCUMENTS

| | | | | |
|---|---|---|---|---|
| CN | 107769164 | | 3/2018 | |
| CN | 110618378 | | 12/2019 | |
| CN | 211626768 | U * | 10/2020 | G01L 1/225 |
| DE | 4441070 | | 5/1996 | |
| DE | 102017214907 | | 2/2019 | |
| EP | 0469174 | | 2/1991 | |
| EP | 1480049 | | 11/2004 | |
| EP | 2988419 | | 2/2016 | |
| EP | 2988419 | A1 * | 2/2016 | G05B 19/0425 |
| JP | 2004177870 | | 6/2004 | |

OTHER PUBLICATIONS

Zheng, Qingshui et al. "Research on a fast identified circuit of short-circuit current", Transactions of China Electrotechnical Society, vol. 19, No. 3, pp. 99-102, Mar. 26, 2004.

* cited by examiner

ARRANGEMENT AND METHOD FOR MONITORING A PLURALITY OF SHORT-CIRCUIT FORMING INDICATING ELEMENTS

BACKGROUND OF THE INVENTION

1. Field of the Invention

The invention relates to an arrangement and method for monitoring short-circuit forming indicating elements.

2. Description of the Related Art

Indicating elements, such as pressure sensitive mats or emergency stop buttons, are used within the scope of safety controllers above all in the industrial field to safely switch on and off electrical loads, such as pressing or milling tools, so as to prevent danger to humans and material.

The safety controllers typically have a number of switching inputs and switching outputs for connecting the operating contacts of the indicating elements.

In addition to monitoring the switching position of the indicating elements, a continuous functional check of the safety controller is also required here in order to fulfill the relevant safety standards and certifications. For particularly high safety levels, this also comprises in particular constantly checking the cabling of the connected indicating elements.

This check typically occurs via blanking intervals in the logical signals at the switching outputs. With typical, digital logics, either a logical 1 or a logical 0, which are differentiated by specific voltage values, is present at the switching outputs. Therefore, a voltage of +24 V is typically assigned to the logical 1, while the grounding potential represents the logical 0.

In order to identify whether the voltage present at the switching inputs of the safety controller actually also matches the output voltage of the safety controller, the output voltage is provided with regular blanking intervals.

In the event of a cable fault, with for instance a cross-fault with another cable with a corresponding voltage, this blanking interval at the switching input can no longer be established and the fault can be identified.

In addition to identifying a short-circuit, this principle is frequently also used to determine the switching state of what are known as short-circuit forming indicating elements. These indicating elements have two current paths with an input and an output in each case, which are short-circuited during actuation.

In order to determine the switching state of an indicating element, both the first input and the second input of the indicating element are supplied with a voltage signal provided with blanking intervals. The blanking intervals are, however, temporally offset here so that the blanking intervals in the two current paths always occur at different times. If the indicating element is actuated and the current paths thus short-circuited, then the blanking intervals are bridged, just as with a short-circuit. They can therefore no longer be established at the outputs of the current paths, which are connected to the switching inputs of the safety controller, and the safety controller can identify the actuation of the indicating element.

The actuation is identified by comparing the input and output signal, and upon actuation of the indicating element a difference only occurs during a blanking interval. As a result, the detection accuracy is limited by the frequency of the blanking intervals. There is therefore always an offset between the actual actuation and detection and a very short actuation of the signaling element is not even detected at all if this short actuation occurs between two blanking intervals. Moreover, the system always requires the knowledge of the accurate position of the blanking intervals in respect of the signal evaluation.

According to the teaching in EP 2 988 419 B1, it is therefore proposed to supply the two inputs of the signaling element with symmetrical rectangular signals that are phase-offset by 180°, in which blanking intervals and switch-on duration are of equal length.

It is therefore possible to identify the actuating state of the indicating element in a particularly simple and safe manner in the case of an individual indicating element via a simple either/or evaluation.

When a plurality of indicating elements are used, in accordance with the prior art, these are typically connected in series. As a result, an evaluation is only possible for the totality of the indicating elements and individual elements are not identified individually.

SUMMARY OF THE INVENTION

In view of the foregoing, it is therefore an object of the invention to provide an apparatus and method that permits a simple evaluation of the actuating state and the identification of cable faults via a number of indicating elements.

This and other objects and advantages are achieved in accordance with the invention by method for monitoring a plurality of short-circuit forming indicating elements, each indicating element including a plurality of current paths which are short-circuited upon actuation of the indicating element.

The objects and advantages are also achieved in accordance with the invention by an arrangement including a safety controller having a plurality of signal outputs and signal inputs, and short-circuit forming indicating elements that each have a plurality of current paths that are short-circuited upon actuation of the indicating element and which are connected to the signal outputs and signal inputs of the safety controller.

BRIEF DESCRIPTION OF THE DRAWINGS

The invention is explained in more detail using the figures, in which.

DETAILED DESCRIPTION OF THE EXEMPLARY EMBODIMENTS

Figure 1:
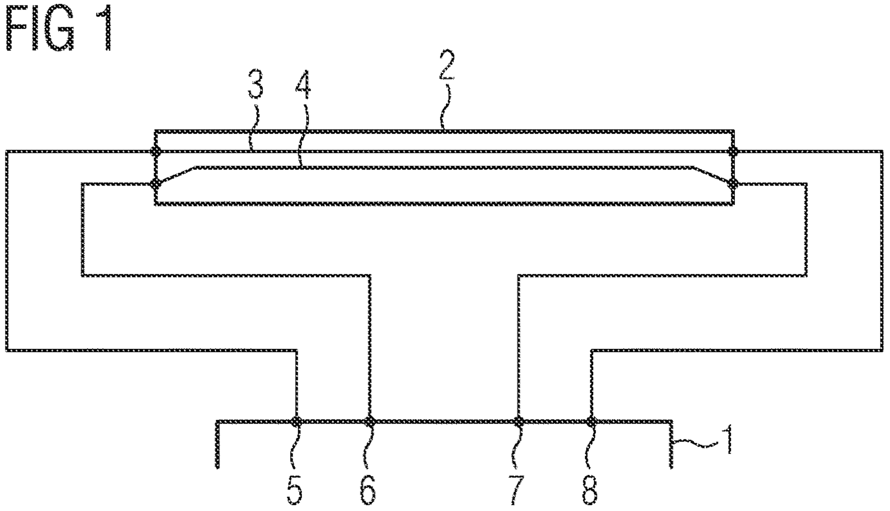
FIG. 1 shows a schematic representation of a safety controller with a connected pressure-sensitive mat in accordance with the invention.

The representation of FIG. 1 shows a safety controller 1 with a control unit (not shown) which can be formed as a microcontroller, for instance.

The safety controller 1 has two switching outputs 4, which are inserted into the current supply of an electrical load, which is to be safely switched off in the event of an emergency.

A pressure sensitive mat 2 is provided as a short-circuit forming indicating element and has two parallel current paths 3, 4. The inputs of the current paths 3, 4 are connected to switching outputs 5, 6 of the safety controller 1 and the outputs of the current paths are connected to switching inputs 7, 8 of the safety controller.

The pressure sensitive mats 2 are used to safeguard larger areas. They are placed on the floor in dangerous working areas of electrical loads. If a pressure sensitive mat 2 is stepped on, a short-circuit occurs between the two current paths 3,4. This short circuit is identified by the safety device 1 by monitoring the corresponding signal inputs 7,8 and the load is switched off.

In accordance with legal requirements, it is not only the tripping of the mats that requires monitoring but, instead, the correct function of the indicating elements. Faults may occur, for instance, in the supply lines of the current paths as a result of a wire breakage or a short-circuit, for instance.

In accordance with the invention, when several pressure sensitive mats are used, the current paths of the same are applied with different signal sequences $S_1 \ldots S_n$, $\overline{S}_1 \ldots \overline{S}_n$ such that a simple, decodable, unique, binary representation of the state of the connected pressure sensitive mats 2 exists at each time instant within a predetermined time frame. Here, the respective second of the two current paths 4 of an indicating element is applied with the inverted signal sequence $\overline{S}_1 \ldots \overline{S}_n$ of the respective first current path 3.

Figure 2:
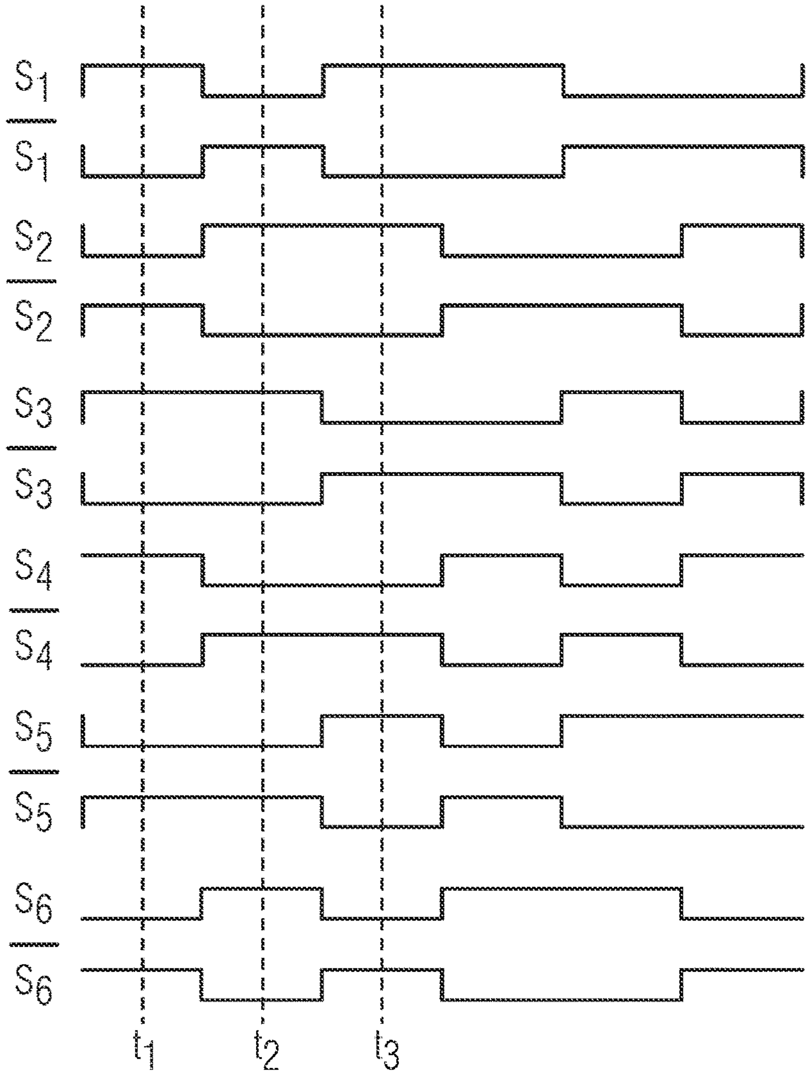
FIG. 2 shows a graphical representation of the different switching signals at switching outputs of the safety controller.

FIG. 2 shows the switching signals at 12 different switching outputs 5,6 of the safety controller 1 for connection to the respective two parallel current paths of 6 pressure sensitive mats 2. At time instant t1 of this representation, the (safe) state of the pressure sensitive mats 2 is defined by the binary number 10 01 10 10 01 01, for instance.

Overall, different binary numbers show the safe state of the 6 pressure sensitive mats in the decoded time frame 6.

A deviation therefrom indicates the presence of a tripping operation. Therefore, the binary number $\underline{11}$ 01 10 10 01 01 indicates for instance that pressure sensitive mat No. 1 was stepped on at time instant t1 and a short-circuit occurred between the two current paths 3,4 of this pressure sensitive mat.

However, this statement is not clear because, in the event of a fault, a short-circuit between the supply line to the second current path of the first mat and the supply line to the first current circuit of the third mat also indicates a corresponding binary number $\underline{11}$ 01 10 10 01 01.

To differentiate whether a tripping operation or a fault exists, it is therefore necessary to observe several consecutive time instants $t_1$, $t_2$, $t_3$ in the signal curve.

Therefore, if tripping occurs as a result of the first mat being stepped on at the three time instants ($\underline{11}$, $\underline{11}$, $\underline{11}$), then the signal values $\overline{S}_1$ and $S_3$ would therefore be continuous 11, while the short circuit between the supply line to the second current path of the first mat and the supply line to the first current circuit of the third mat produces the signal values $\overline{S}_1$ and $S_3$ (11, 11, 00) at the three time instants.

To quickly determine the cause, the switching signals $\overline{S}_1 \ldots \overline{S}_n$ are to be established clearly as in FIG. 2. Each signal has a sequence of a short impulse and a short blanking interval and a long impulse and a long blanking interval which recur periodically, where impulses and blanking intervals each have the same duration and the long impulses or blanking intervals have twice the duration of the short impulses or blanking intervals.

The switching signals $S_1$ and $\overline{S}_1$ to be assigned to an individual mat have a concurring phase position, the signals of the different mats are phase shifted with respect to one another, the duration of the shift between 2 adjacent signals in other words, for instance, between $S_1$ and $S_2$ or $S_2$ and $S_3$ corresponds in the present case to 6 mats of the duration of a narrow impulse or a sixth of the cycle duration of the signal, and thus a phase shift of 60°, i.e. 360°/n with n=number of mats, in the present case six.

The existing signal setup is suitable for controlling up to 6 mats. With a larger number, there is therefore the possibility, for instance, to extend the signals by a second short impulse with blanking intervals.

It should be understood it is also conceivable to leave the base signal with a short and a long impulse plus blanking intervals, and to reduce the phase shift or the duration of the shift between 2 adjacent signals to half of a narrow impulse.

Figure 3:
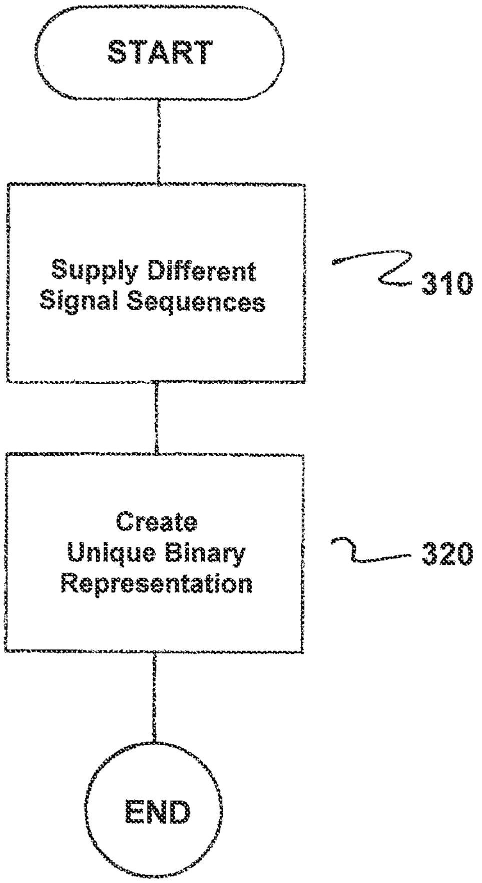
FIG. 3 is a flowchart of the method in accordance with the invention.

FIG. 3 is a flowchart of the method for monitoring a plurality of short-circuit forming indicating elements, each indicating element including a plurality of current paths which are short-circuited upon actuation of the indicating element.

The method comprises supplying the plurality of current paths 3,4 of the indicating elements 2 with different signal sequences $S_1 \ldots S_n$, $\overline{S}_1 \ldots \overline{S}_n$, as indicated in step 310.

Next, a simple, decodable, unique, binary representation of the state of the connected pressure sensitive mats 2 is created at each time instant within a predetermined time frame based on the supplied different signal sequences $S_1 \ldots S_n$, $\overline{S}_1 \ldots \overline{S}_n$, as indicated in step 320. In accordance with the invention, it thus becomes possible to differentiate a stepping on the pressure sensitive mat from an error in the supply lines to the current paths.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for monitoring a plurality of short-circuit forming indicating elements, each indicating element including a plurality of current paths which are short-circuited upon actuation of the indicating element, the method comprising:

supplying the plurality of current paths of the plurality of short-circuit forming indicating elements with different signal sequences;

creating a decoded binary representation of a state of connected indicating elements at each time instant within a predetermined time frame based on the supplied different signal sequences;

wherein stepping on each indicating element is differentiable from an error in supply lines to the plurality of current paths;

wherein each signal sequence has a periodically recurring sequence of a short impulse and a short blanking interval and a long impulse and a long blanking interval;

wherein impulses and blanking intervals each have the same duration and the long impulse or blanking intervals have twice the duration of the short impulse or blanking intervals; and wherein switching signals to be assigned to an individual indicating element have a concurring phase position and the signal sequences of different indicating elements are phase shifted by 60° with respect to one another.

2. The method as claimed in claim 1, wherein the respective second current path of the plurality of current paths of an indicating element is supplied with an inverted signal sequence of a respective first current path of the plurality of current paths.

3. The method as claimed in claim 1, wherein pressure sensitive mats are provided as indicating elements, which are configured such that a short circuit between the plurality of current paths is caused when a pressure sensitive mat is stepped on.

4. A method for monitoring a plurality of short-circuit forming indicating elements, each indicating element including a plurality of current paths which are short-circuited upon actuation of the indicating element, the method comprising:

supplying the plurality of current paths of the plurality of short-circuit forming indicating elements with different signal sequences;

creating a decoded binary representation of a state of connected indicating elements at each time instant within a predetermined time frame based on the supplied different signal sequences;

wherein stepping on each indicating element is differentiable from an error in supply lines to the plurality of current paths;

wherein each signal sequence has a periodically recurring sequence of a short impulse and a short blanking interval and a long impulse and a long blanking interval;

wherein impulses and blanking intervals each have the same duration and the long impulses or blanking intervals each have twice the duration of the short impulse or blanking intervals; and wherein switching signals to be assigned to an individual indicating element have a concurring phase position and the signal sequences of different indicating elements are phase shifted by 360°/n with respect to one another with n equating to the number of indicating elements.

5. The method as claimed in claim 4, wherein the respective second current path of the plurality of current paths of an indicating element is supplied with an inverted signal sequence of a respective first current path of the plurality of current paths.

6. The method as claimed in claim 4, wherein pressure sensitive mats are provided as indicating elements, which are configured such that a short circuit between the plurality of current paths is caused when a pressure sensitive mat is stepped on.

7. A method for monitoring a plurality of short-circuit forming indicating elements, each indicating element including a plurality of current paths which are short-circuited upon actuation of the indicating element, the method comprising:

supplying the plurality of current paths of the plurality of short-circuit forming indicating elements with different signal sequences;

creating a decoded binary representation of a state of connected indicating elements at each time instant within a predetermined time frame based on the supplied different signal sequences;

wherein stepping on each indicating element is differentiable from an error in supply lines to the plurality of current paths;

wherein each signal sequence has a periodically recurring sequence of two short impulses and a short blanking interval and a long impulse and a long blanking interval;

wherein impulses and blanking intervals each have the same duration and the long impulse or blanking intervals each have twice the duration of the short impulses or blanking intervals; and wherein switching signals to be assigned to an individual indicating element have a concurring phase position and the signal sequences of different indicating elements are phase shifted by 40° with respect to one another.

8. The method as claimed in claim 7, wherein the respective second current path of the plurality of current paths of an indicating element is supplied with an inverted signal sequence of a respective first current path of the plurality of current paths.

9. The method as claimed in claim 7, wherein pressure sensitive mats are provided as indicating elements, which are configured such that a short circuit between the plurality of current paths is caused when a pressure sensitive mat is stepped on.

* * * * *